(12) United States Patent
Chang

(10) Patent No.: US 6,218,817 B1
(45) Date of Patent: Apr. 17, 2001

(54) VOLTAGE-SWITCHING REGULATOR WITH BUILT-IN VOLTAGE-SWITCHING MODULE FOR A MEMORY MODULE

(75) Inventor: Nai-Shung Chang, Taipei Hsien (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 09/562,678

(22) Filed: May 2, 2000

(30) Foreign Application Priority Data

Jul. 15, 1999 (TW) .................................................. 88211845

(51) Int. Cl.[7] ........................................................ G05F 1/40
(52) U.S. Cl. .............................................. 323/283; 323/267
(58) Field of Search ..................................... 323/282, 283, 323/284, 288, 267

(56) References Cited

U.S. PATENT DOCUMENTS 4,634,903 * 1/1987 Montorfano ......................... 323/283
5,808,455 * 9/1998 Schwartz et al. .................... 323/283

* cited by examiner

Primary Examiner—Shawn Riley
(74) Attorney, Agent, or Firm—Jiawei Huang; J C Patents

(57) ABSTRACT

A voltage-switching regulator with built-in voltage-switching module is provided, which is capable of supplying a terminal voltage to a memory unit operating under DDR (DRAM of Double Rate) mode. The voltage-switching regulator is implemented as a single IC chip with a built-in voltage-switching module, and is capable of generating a terminal voltage in response to an input reference voltage and transferring the terminal voltage via a transmission logic line to the memory unit operating under DDR mode. The terminal voltage is pulled up when the voltage-switching module supplies a drive current and is pulled down when the voltage-switching module supplies a sink current. This allows the memory unit to be operated under DDR mode.

15 Claims, 3 Drawing Sheets

VOLTAGE-SWITCHING REGULATOR WITH BUILT-IN VOLTAGE-SWITCHING MODULE FOR A MEMORY MODULE

CROSS-REFERENCE TO RELATED APPLICATION

This application claims the priority benefit of Taiwan application serial no. 88211845, filed Jul. 15, 1999.

BACKGROUND OF THE INVENTION

1. Field of the Invention

This invention relates to voltage supply means, and more particularly, to a voltage-switching regulator with built-in voltage-switching module for supplying a terminal voltage to a memory unit operating under DDR (DRAM of Double Rate) mode.

2. Description of Related Art

Computer memory devices, such as SDRAM (Synchronous Dynamic Random-Access Memory), are basically driven by a clock signal in such a manner that each access action is activated either by the rising edges or the falling edges in the clock signal. Under the so-called DDR (DRAM of Double Rate) mode, the access operations can be activated both at the rising edges and the falling edges in the clock signal, thereby doubling the access speed to the memory.

Under the DDR mode of operation, however, it is required to supply a drive current ($I_d$) or a sink current (Is) to the data bus of the memory so that the terminal voltage ($V_{TT}$) on the data bus to can be pulled up or down. This requirement is conventionally provided by using a separate voltage-switching regulator IC which is externally connected to the data bus of the memory.

FIG. 1A shows a conventional configuration for the use of an externally-connected voltage-switching regulator IC (here designated by the reference numeral 14). In the case of FIG. 1A, for example, the voltage-switching regulator IC 14 is externally connected via an SSTL (Series Stub Terminated Logic) line to a memory unit 12 composed of four memory modules 12a, 12b, 12c, 12d for the purpose of supplying a terminal voltage $V_{TT}$ to the memory unit 12 during access operations. A memory controller 10 is used to control the access operations to the memory unit 12. The SSTL line includes a pair of first resistors $R_T$ and a second resistor $R_S$, where $R_T$=56 Ω (ohm) and $R_S$=33 Ω, for example. The terminal voltage $V_{TT}$ outputted from the voltage-switching regulator IC 14 varies with the input reference voltage $V_{REF}$.

FIG. 1B shows the same of FIG. 1B except for the use of a GTL+ (Gunning Transceiver Logic) line instead of an SSTL line to supply the terminal voltage $V_{TT}$ to the memory unit 12. The GTL+ line differs from the SSTL line only in that it includes only the two resistors $R_T$ (the resistor $R_S$ used in the SSTL line is here removed).

One drawback to the use of the foregoing voltage-switching regulator IC 14, however, is that, since it is a separate IC device externally connected to the memory controller 10 and the memory unit 12, it requires an additional layout area on the motherboard for mounting, making the manufacture of the motherboard more complex in process and thus cost-ineffective to implement.

SUMMARY OF THE INVENTION

It is therefore an objective of this invention to provide a voltage-switching regulator with built-in voltage-switching module, which is implemented in a single IC chip and can be used to supply various voltages to the motherboard, including the power to the CPU and a terminal voltage to the memory unit during access operations.

It is another objective of this invention to provide a voltage-switching regulator with built-in voltage-switching module, which integrates various voltage supply units in a single IC unit, so that the layout area on the motherboard can be saved to allow the manufacture of motherboard more cost-effective.

In accordance with the foregoing and other objectives, the invention proposes a new voltage-switching regulator with built-in voltage-switching module.

The voltage-switching regulator of the invention includes: an IC chip having an input port for receiving a reference voltage and at least one output port for outputting the terminal voltage. Further, the voltage-switching regulator includes a built-in voltage-switching module integrated in the IC chip, which is capable of generating an output voltage serving as the terminal voltage in response to an input reference voltage and outputting the terminal voltage via a transmission logic line to the memory unit operating under DDR mode. The terminal voltage is pulled up when the voltage-switching module supplies a drive current and is pulled down when the voltage-switching module supplies a sink current.

The foregoing voltage-switching regulator of the invention can be implemented as a single IC unit with the built-in voltage-switching module, so that the voltage-switching regulator of the invention is capable of supplying a plurality of working voltages for various purposes, including, for example, a core voltage and a working voltage to the CPU and a terminal voltage to pull up or down the voltage state on the data bus connected via the transmission logic line to the memory unit. the transmission logic line can be either an SSTL line or a GTL+ line.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a voltage-switching regulator which is implemented as an IC chip with a built-in voltage-switching module, and which is capable of supplying power to a CPU as well as supplying a terminal voltage to a memory unit operating under DDR (DRAM of Double Rate) mode to pull up or down the voltage state on the data bus connected to the memory unit. Details of the invention are disclosed in the following with reference to FIGS. 2 through 4.

Figure 1A:
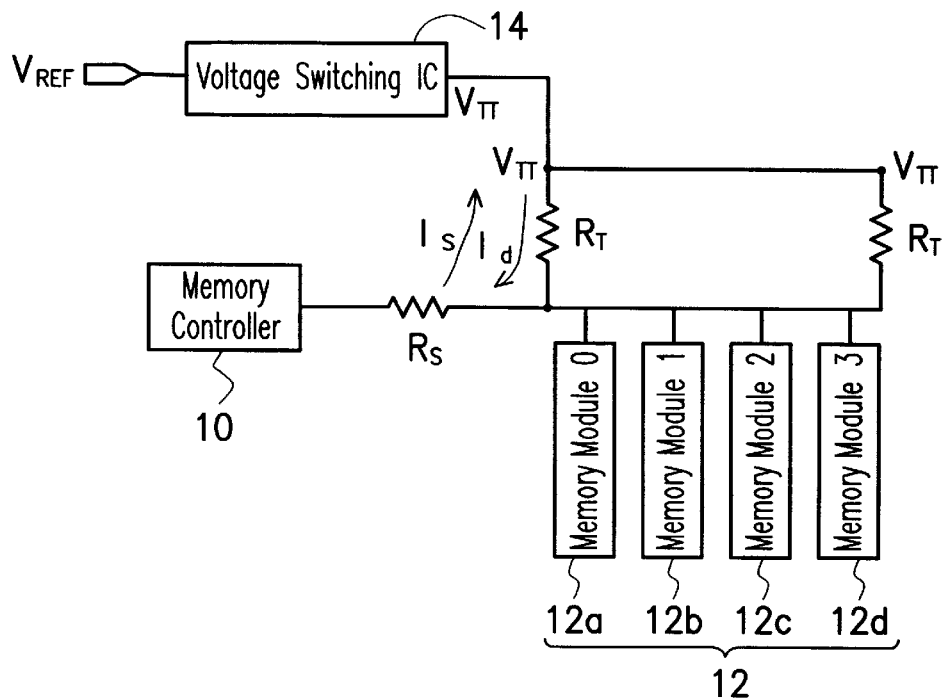
FIG. 1A (PRIOR ART) is a schematic diagram used to depict a conventional SSTL configuration for external connection of a separate voltage-switching regulator IC to a memory unit.
Figure 1B:
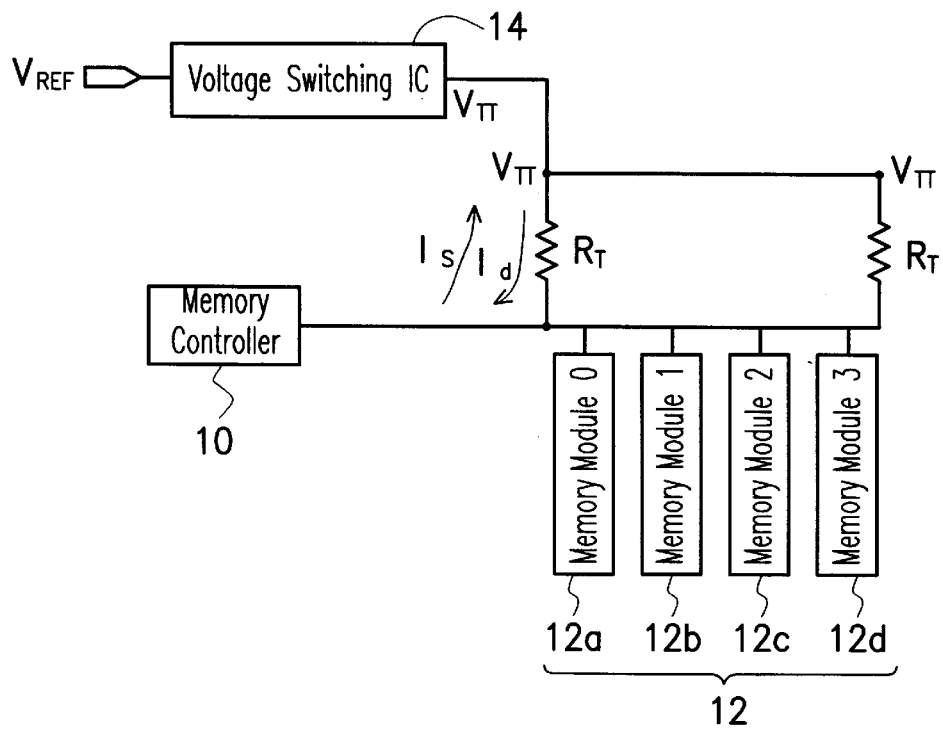
FIG. 1B (PRIOR ART) is a schematic diagram used to depict a conventional GTL+ configuration for external connection of a separate voltage-switching regulator IC to a memory unit.
Figure 2:
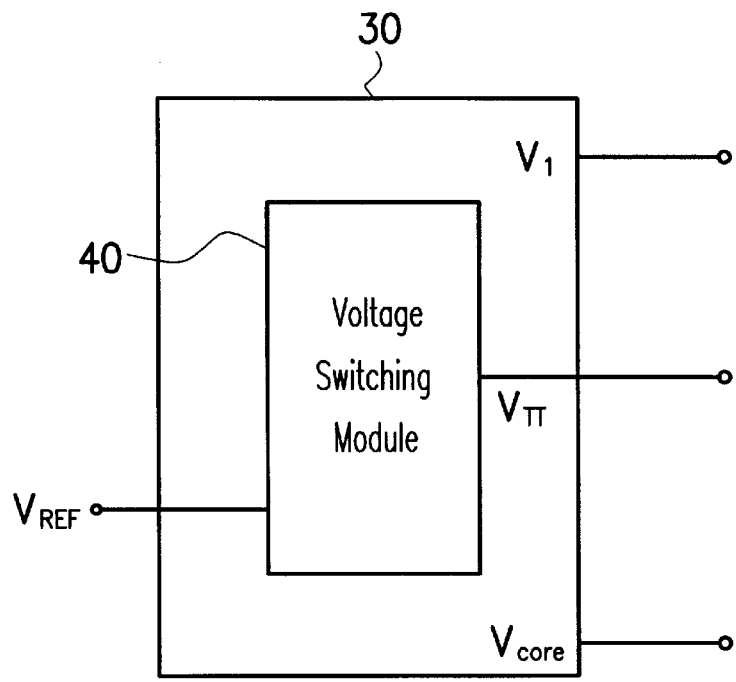
FIG. 2 is a schematic diagram showing the voltage-switching regulator with built-in voltage-switching module according to the invention.

FIG. 2 is a schematic diagram showing the voltage-switching regulator with built-in voltage-switching module according to the invention. As shown, the voltage-switching regulator of the invention, here designated by the reference numeral 30, is implemented as a single IC chip with a built-in voltage-switching module 40. As shown, the voltage-switching regulator 30 of the invention has an input port for receiving an input reference voltage $V_{REF}$ and a plurality of output ports respectively for outputting a terminal voltage $V_{TT}$, a core voltage $V_{core}$, and a working voltage $V_1$.

The built-in voltage-switching module 40 is incorporated as an integrated part of the voltage-switching regulator 30 of the invention, and is used to generate a terminal voltage $V_{TT}$ in response to the input reference voltage $V_{REF}$. The output port of the terminal voltage $V_{TT}$ is connected to the data bus of the memory so as to either supply a drive current ($I_d$) for pulling up the voltage state on the data bus, or supply a sink current ($I_s$) for pulling down the voltage state on the data bus. This feature allows the memory connected to the voltage-switching regulator 30 of the invention to be operable under DDR mode.

Figure 3:
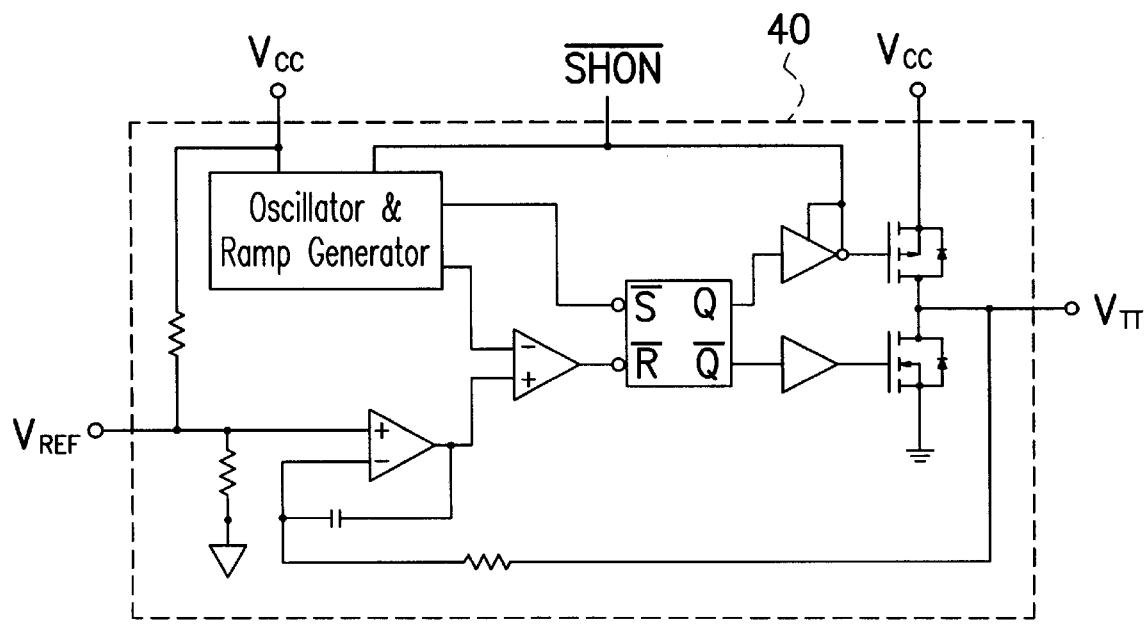
FIG. 3 is a schematic diagram showing detailed inside circuit structure of the built-in voltage-switching module in the voltage-switching regulator of the invention.

FIG. 3 is a schematic diagram showing detailed inside circuit structure of the voltage-switching module 40 shown in FIG. 2. The circuit structure shown in FIG. 3 is a demonstrative example of the voltage-switching module 40, which is conventional art and not within the spirit and scope of the invention.

The voltage-switching module 40 is capable of outputting a terminal voltage $V_{TT}$ in the range of from 2.5 V to 6 V depending on the level of the input reference voltage $V_{REF}$. For instance, if $V_{REF}$=1.5 V, then $V_{TT}$=1.5 V. To pull up or down the voltage state, a drive current ($I_d$) or a sink current ($I_s$) of 1 A (ampere) is provided by the voltage-switching module 40.

The output voltage $V_{TT}$ from the voltage-switching module 40 is used as a terminal voltage to a bus interface, such as HSTL, GTL+, or SSTL, that is connected to a memory unit operating under DDR mode. One example of the application of the voltage-switching regulator 30 of the invention is shown in FIG. 4.

Figure 4:
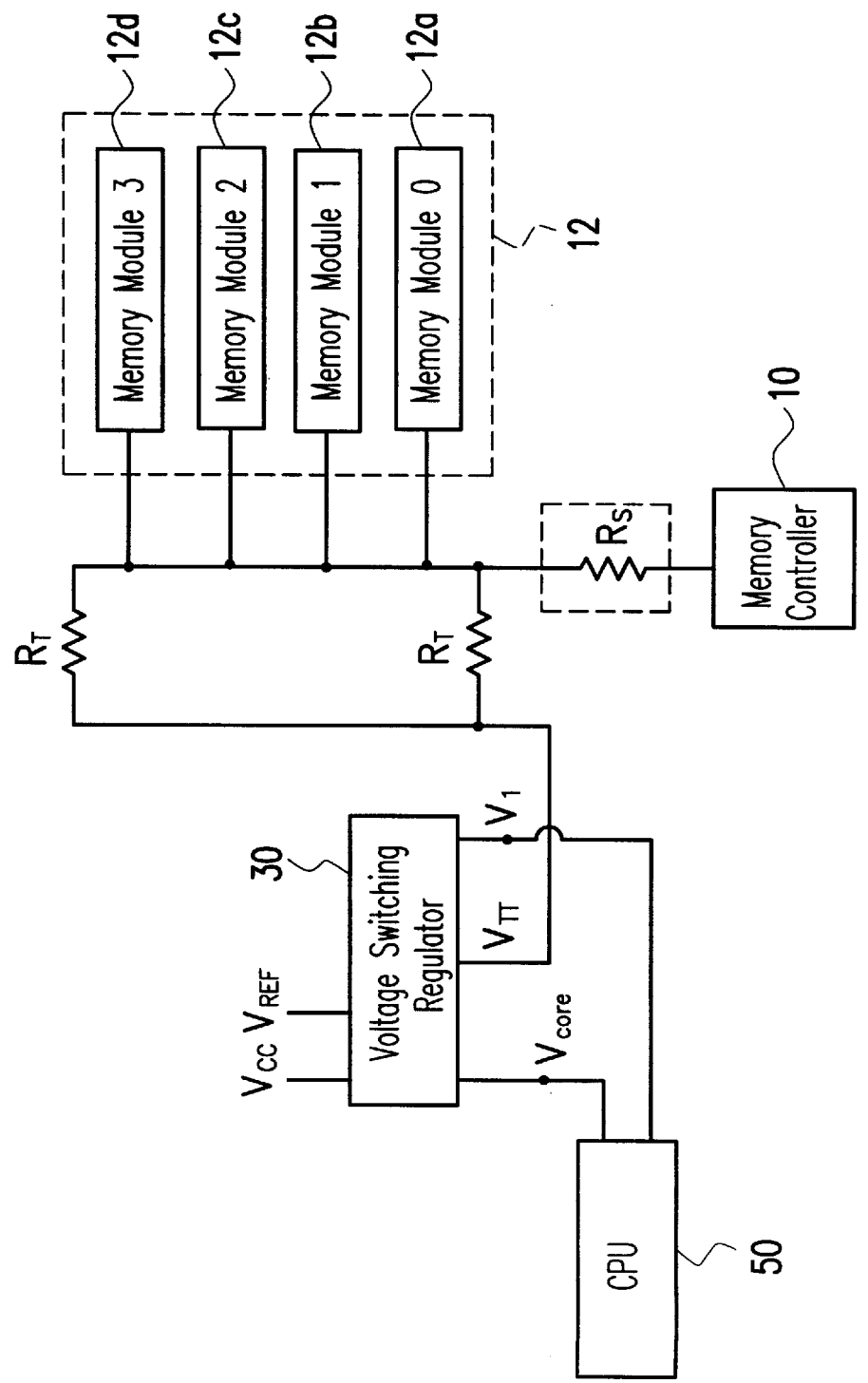
FIG. 4 is a schematic diagram showing the use of the voltage-switching regulator of the invention in conjunction with a memory unit operating under DDR mode.

FIG. 4 is a schematic diagram showing the use of the voltage-switching regulator 30 of the invention in conjunction with a motherboard on which a memory controller 10, a memory unit 12, and a CPU 50 are mounted. The memory unit 12 is composed of four memory modules 12a, 12b, 12c, 12d.

The voltage-switching regulator 30 of the invention, as mentioned above, is capable of supplying a terminal voltage $V_{TT}$, a core voltage $V_{core}$, and a working voltage $V_1$. In the case of FIG. 4, the core voltage $V_{core}$ and the working voltage $V_1$ are supplied to the CPU 50. On the other hand, the terminal voltage $V_{TT}$ is supplied via a transmission logic line to the memory unit 12 so as to either pull up or pull down the voltage state on the data bus connected to the memory unit 12. The transmission logic line can be either an SSTL line or a GTL+ line. In the case of using SSTL line, the resistors $R_T$ and $R_S$ are all required; whereas, in the case of using GTL+ line, the resistors $R_T$ and $R_S$ are unnecessary.

In conclusion, the invention provides a voltage-switching regulator 30 which is implemented as a single IC unit, and which integrates a built-in voltage-switching module 40 therein so that the voltage-switching regulator 30 of the invention is capable of supplying a plurality of working voltages for various purposes, including, for example, a core voltage $V_{core}$ and a working voltage $V_1$ to the CPU 50 and a terminal voltage to pull up or down the voltage state on the data bus connected to the memory unit 12. This feature allows the use of only one single IC chip, i.e., the voltage-switching regulator 30, to supply power to the CPU as well as supply a terminal voltage for pull-up and pull-down purposes. The layout space on the motherboard can therefore be reduced.

Compared to the prior art, the voltage-switching regulator of the invention has the following advantages.

First, the voltage-switching regulator of the invention includes a built-in voltage-switching module, allowing one single IC chip to supply power to the CPU as well as supply a terminal voltage to the memory unit operating under DDR mode. The use of the voltage-switching regulator of the invention is therefore more convenient than the prior art.

Second, the integration of the built-in voltage-switching module in the voltage-switching regulator can help save the layout space on the motherboard where the CPU and the memory unit are mounted, thus making the manufacture of the motherboard more cost-effective than the prior art.

Third, the voltage-switching regulator together with the built-in voltage-switching module can be fabricated by the IC manufacturer without having to purchase additional IC chips that have voltage-switching regulation capabilities. The invention thus allows the manufacture of the voltage-switching regulator to be more cost-effective than the prior art.

Fourth, the integration of the built-in voltage-switching module in the voltage-switching regulator can help reduce the number of IC components on the motherboard, thereby saving component cost and simplifying the assembly procedure for the motherboard.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A voltage-switching regulator for supplying an output voltage to the memory unit and voltages to a central processor unit (CPU), which comprises:
    an input port for receiving a reference voltage;
    a plurality of output ports; and
    a built-in voltage-switching module, which is integrated in the voltage-switching regulator, and which is capable of generating the output voltage in response to an input reference voltage and outputting the output voltage via one of the output ports, the output voltage being pulled up when the voltage-switching module supplies a drive current and being pulled down when the voltage-switching module supplies a sink current.

2. The voltage-switching regulator of claim 1, wherein the drive current and the sink current are both 1 A.

3. The voltage-switching regulator of claim 1, wherein the voltage-switching module has an output voltage range of from 2.5 V to 6 V.

4. The voltage-switching regulator of claim 1, wherein the output voltage is serving as a terminal voltage transmitted via a transmission logic line to a memory unit.

5. The voltage-switching regulator of claim 4, wherein the transmission logic line is a Series Stub Terminated Logic line.

6. The voltage-switching regulator of claim 1, wherein the transmission logic line is a Gunning Transceiver Logic line.

7. The voltage-switching regulator of claim 1, further comprising:
   means for supplying a core voltage and a working voltage to a CPU.

8. The voltage-switching regulator of claim 7, wherein the working voltage is 2.5 V.

9. A voltage-switching regulator for use in conjunction with a memory unit operating under DDR mode for supplying a terminal voltage to the memory unit, which comprises:
   an IC chip having an input port for receiving a reference voltage and at least one output port for outputting the terminal voltage; and
   a built-in voltage-switching module, which is integrated in the IC chip, and which is capable of generating an output voltage serving as the terminal voltage in response to an input reference voltage and outputting the terminal voltage via the output port to the memory unit operating under DDR mode, the terminal voltage being pulled up when the voltage-switching module supplies a drive current and being pulled down when the voltage-switching module supplies a sink current.

10. The voltage-switching regulator of claim 9, wherein the memory unit is an SDRAM unit.

11. The voltage-switching regulator of claim 9, wherein the terminal voltage is transmitted via a transmission logic line to the memory unit.

12. The voltage-switching regulator of claim 11, wherein the transmission logic line is a Series Stub Terminated Logic line.

13. The voltage-switching regulator of claim 11, wherein the transmission logic line is a Gunning Transceiver Logic line.

14. The voltage-switching regulator of claim 9, wherein the drive current and the sink current are both 1 A.

15. The voltage-switching regulator of claim 9, wherein the voltage-switching module has an output voltage range of from 2.5 V to 6 V.

\* \* \* \* \*